(12) United States Patent
Mizukami et al.

(10) Patent No.: US 6,242,685 B1
(45) Date of Patent: Jun. 5, 2001

(54) STRUCTURE AND METHOD OF INSTALLING PHOTOVOLTAIC MODULE

(75) Inventors: Seishiro Mizukami, Kyoto; Takuji Nomura, Otsu, both of (JP)

(73) Assignee: Kaneka Corporation, Osaka (JP)

( * ) Notice: Subject to any disclaimer, the term of this patent is extended or adjusted under 35 U.S.C. 154(b) by 0 days.

(21) Appl. No.: 09/413,007

(22) Filed: Oct. 6, 1999

(30) Foreign Application Priority Data

Mar. 25, 1999 (JP) .................................................. 11-081461

(51) Int. Cl.⁷ .................................................. H01L 31/042
(52) U.S. Cl. .................... 136/244; 136/251; 136/293; 136/256; 136/291; 52/173.3; 438/66

(58) Field of Search ..................................... 136/244, 251, 136/293, 256, 291; 52/173.3; 438/66

(56) References Cited

U.S. PATENT DOCUMENTS 3,769,091 * 10/1973 Leinkram et al. .................... 136/244
5,590,495 * 1/1997 Bressler et al. ....................... 136/244

* cited by examiner

*Primary Examiner*—Alan Diamond
(74) *Attorney, Agent, or Firm*—Hogan & Hartson, LLP

(57) ABSTRACT

A photovoltaic module has a cathode and anode acting as electrodes for collecting an output power. When the photovoltaic module is installed on a roof of a building for example, the cathode is located at a position higher than the anode.

11 Claims, 6 Drawing Sheets

STRUCTURE AND METHOD OF INSTALLING PHOTOVOLTAIC MODULE

BACKGROUND OF THE INVENTION

The present invention relates to a structure and method of installing a photovoltaic module on a roof, etc., at a given location such as on the roof of a building.

A photovoltaic module is known as one way for obtaining electric energy. The photovoltaic module is often installed at a location well exposed to solar energy, such as the roof of a building.

There are two type of photovoltaic modules—a crystalline type and an amorphous type. In one practical form of a thin film amorphous type, transparent conductive films are formed at predetermined intervals in a band-like fashion on one-side (back surface side) of a glass substrate.

A plurality of band-like cells are arranged at predetermined intervals on the transparent conductive film and formed of a semiconductor layer. A back electrode layer is formed on each cell in a stacking fashion. The respective adjacent cells are electrically connected, in a serial array, through the transparent conductive film and back electrode layer.

Bus bars, as output power collecting electrodes, are attached to the transparent conductive films at one end and at the other end. One of the bus bars serves as an anode and the other bus bar serves as a cathode.

The cells formed on the back surface side of the glass substrate are sealed with resin and the resin is covered with a resin film. The longitudinal end sides of the paired bus bars extend through the resin and a power output of the solar cells is obtained across these bus bars.

In the photovoltaic module thus configured, the sealing of the resin at the back side of the glass substrate is achieved by joining a sheet-like resin to the back side, setting the joined area under reduced pressure and further heating the resin.

If any external force is inadvertently applied to the resin and bus bars when the photovoltaic modules are installed or, for example, after such installation is done, then the seal quality by the resin sometimes deteriorates.

In the case where a photovoltaic module with a deteriorated resin-sealing quality is placed on the roof of a building, etc., there is sometimes the case that rainwater seeps into the module and causes corrosion in the photovoltaic module.

BRIEF SUMMARY OF THE INVENTION

It is accordingly the object of the present invention to provide a structure and method of installing a photovoltaic module which reduces the amount of corrosion in the module.

In order to achieve the above-mentioned object of the present invention, an installed structure according to one preferred embodiment of the present invention is provided in which, in the installed structure containing a photovoltaic module having a cathode and anode for taking out a power output, the photovoltaic module has its cathode set in a higher position than the anode.

The present invention is based on the following finding. That is, in their experiments, the inventors have found that the bus area serving as the cathode or solar cells adjacent to the cathode in particular is more likely to be corroded earlier than the bus area serving as the anode.

According to the structure containing the photovoltaic modules, even if rainwater, etc., seeps into the photovoltaic module, since the cathode is set in a higher position than the anode, rainwater is less likely to accumulate and it is possible to prevent the cathode area from being corroded earlier.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principals of the invention.

DETAILED DESCRIPTION OF THE INVENTION

The present invention will be explained below with reference to the accompanying drawings.

Figure 5A:
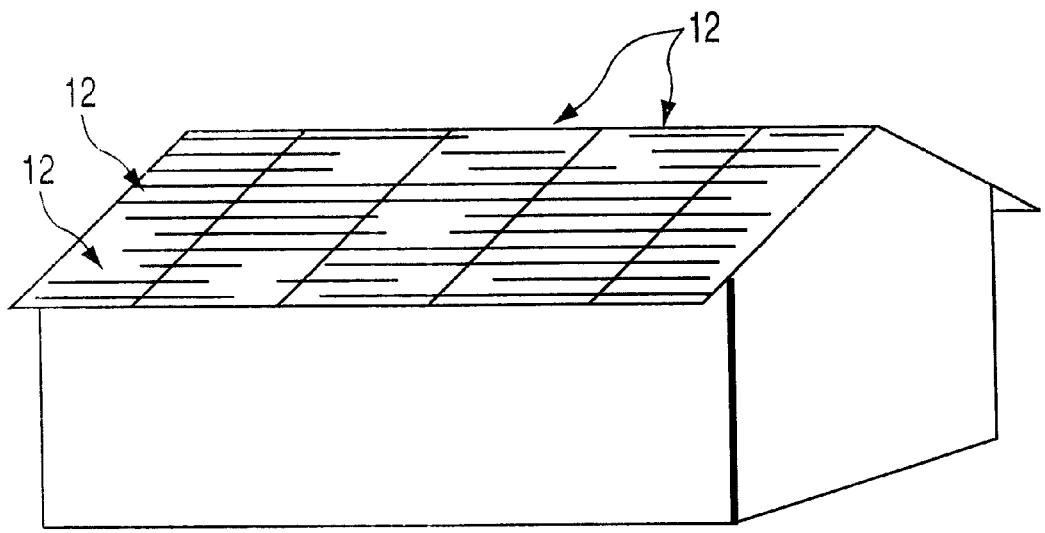
FIG. 5A is a perspective view showing a house on which roof panels are placed.
Figure 5B:
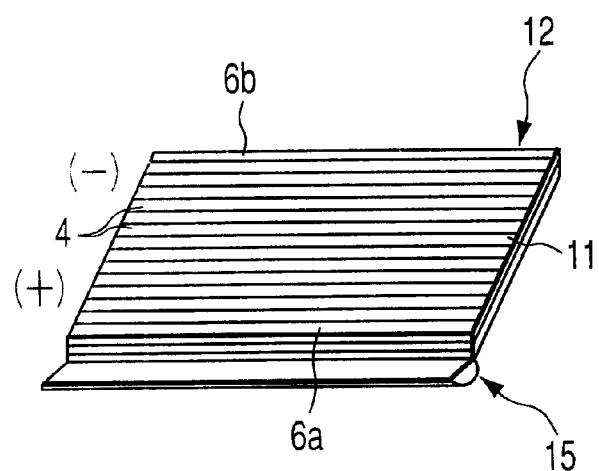
FIG. 5B is a perspective view showing one sheet of the roof panel.
Figure 6:
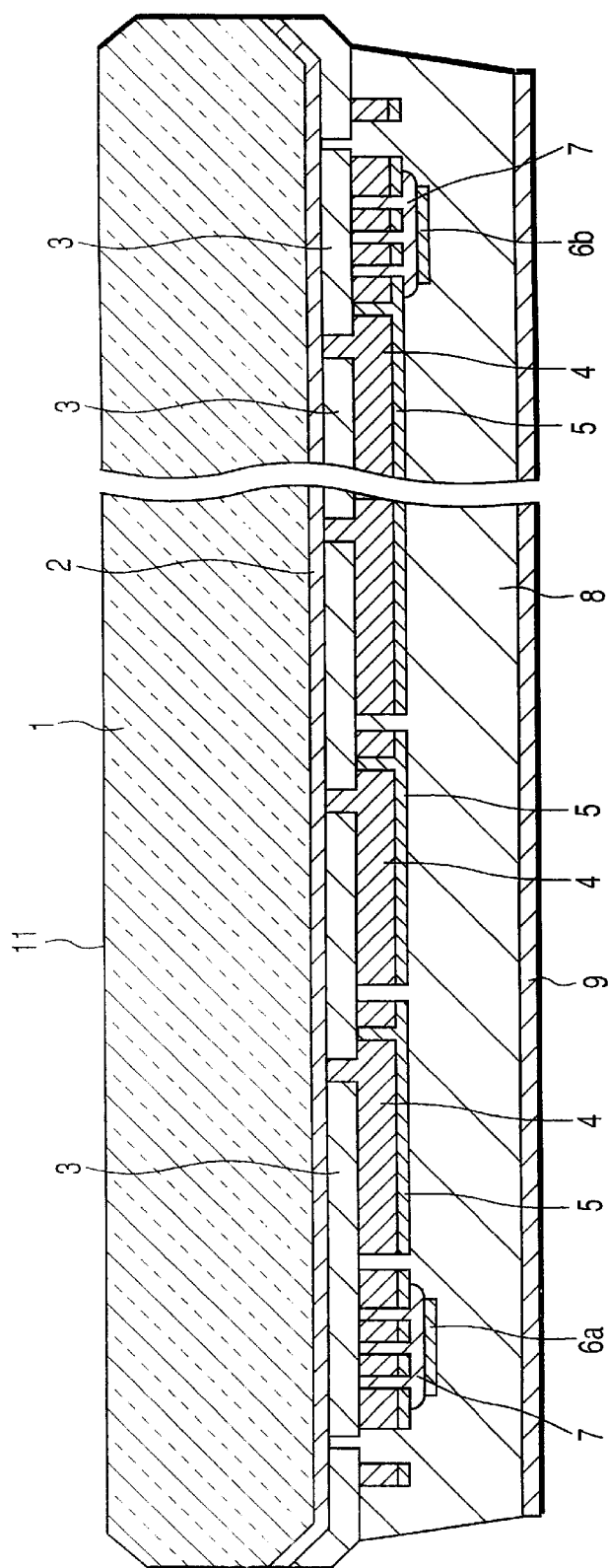
FIG. 6 is a cross-sectional view, partly omitted, showing a photovoltaic module of an amorphous type.

FIGS. 1 to 6 show a first embodiment of the present invention. FIG. 6 shows a photovoltaic module 11 on a glass substrate 1. At the rear surface of a glass substrate 1, transparent conductive films 3 are arranged at predetermined intervals, with an $SiO_2$ film 2 interposed, such that these conductive films extend along substantially the whole length of the glass substrate as viewed in a predetermined direction.

A plurality of band-like cells 4 formed of a semiconductor layer are provided at predetermined intervals on the transparent conductive film 3. Back electrode layers 5 are formed on the respective cells 4 in a stacked way. The adjacent cells 4 are electrically connected in a series array to each other through the transparent conductive film 3 and rear electrode layer 5.

Bus bars 6a, 6b are provided, as output electrodes, on corresponding transparent conductive films 3 situated at one end and the other end as viewed in a direction intersecting with a predetermined direction of the glass substrate 1. The bus bars 6a, 6b can be attached to the transparent conductive films 3 by various methods, involving, but not limited to, soldering. One of the bus bars acts as an anode while the other bus bar acts as a cathode.

The cells 4 formed on the back-surface side of the glass substrate 1 are encapsulated with a resin 8. The resin 8 is covered with a resin film 9. One longitudinal end of the paired bus bars 6a, 6b extends through the resin 8 and resin film 9 and extends to the outside. An output of a solar cell is obtained between the bus bars 6a, 6b.

Figure 2:
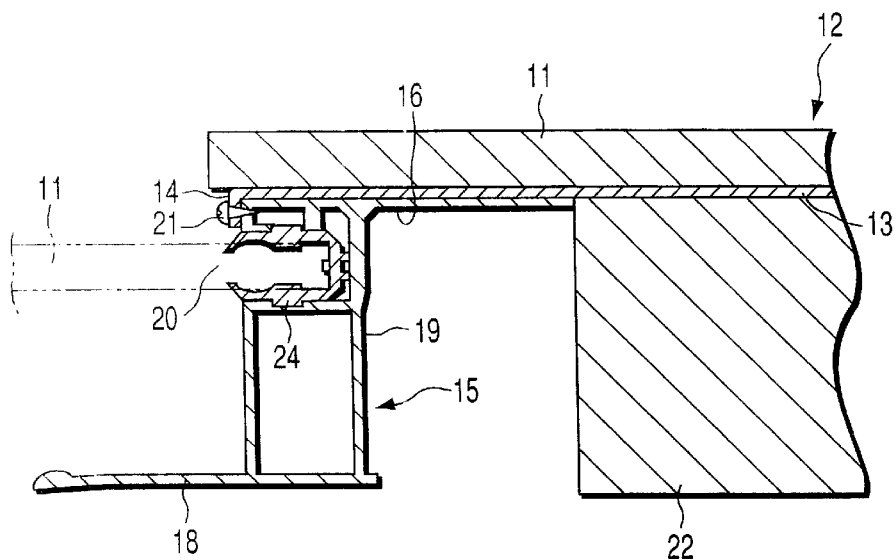
FIG. 2 is an enlarged view showing a forward end side of the roof panel.
Figure 3:
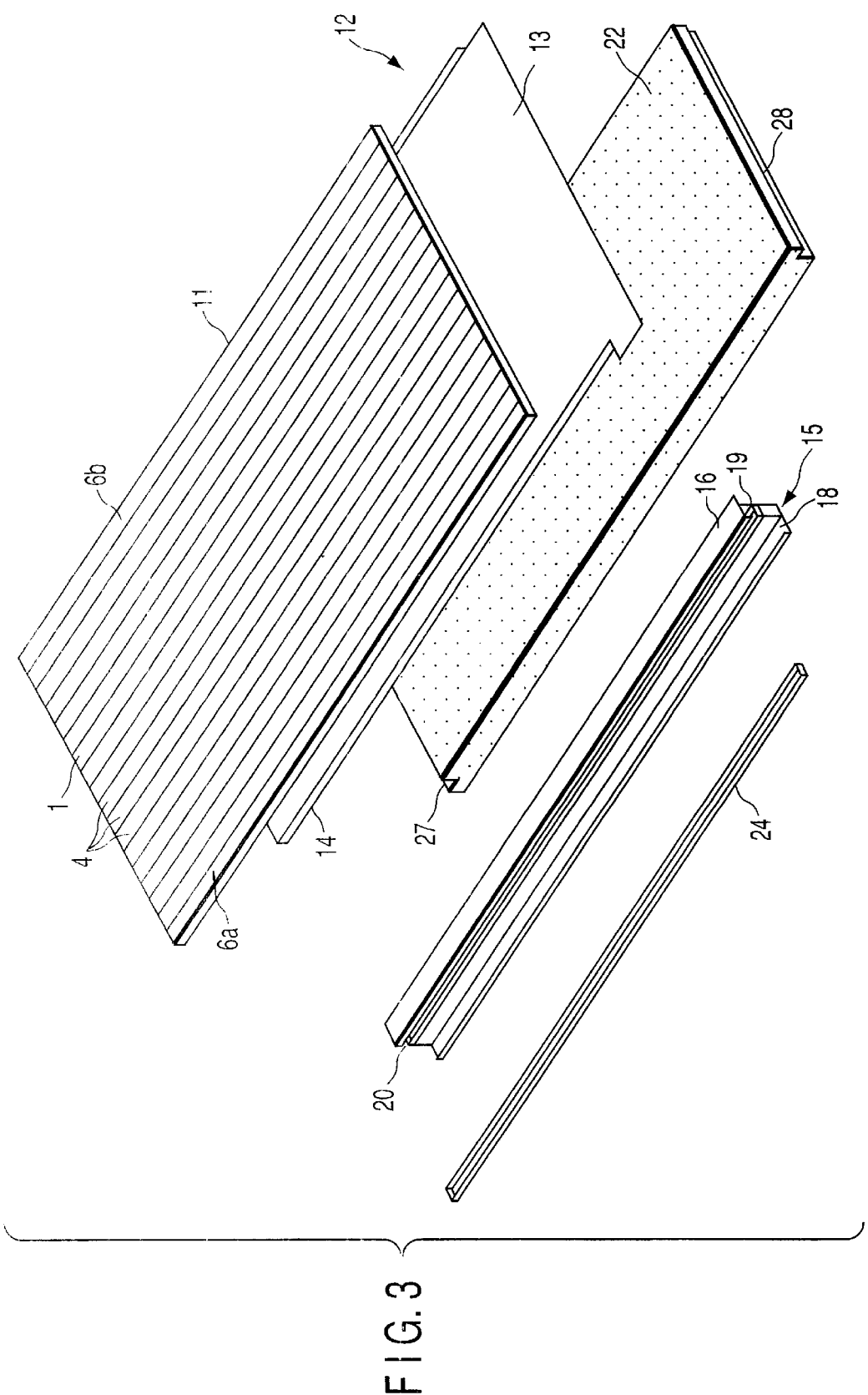
FIG. 3 is an expanded perspective view showing the roof panel.

The photovoltaic module 11 can be utilized as a roof panel 12. That is, as shown in FIGS. 2 and 3, the roof panel 12 has a mounting member 13 joined to a lower surface of the encapsulated photovoltaic module 11 by using adhesives, etc. The mounting member 13 can be formed of various materials, including but not limited to galvanized steel plate, aluminum alloy plate, stainless steel plate, etc.

An L-bent flange section 14 is formed at a forward end side of the mounting member, that is, at a forward end situated at a bus bar 6a side serving as the anode of the photovoltaic module 11. A support fitting 15 is mounted on a lower surface of the forward end side of the flange section 14.

The support fitting 15 can be made of, for example, aluminum by an extrusion molding method. The support fitting 15 is formed as an integral unit from a flat-plate-like upper joining section 16 joined to a lower surface of the mounting member 13, a flat-plate-like lower joining section 18 joined to an underlying member 17 (shown in FIG. 1) of the roof of a house or building and fixed by nails, screws, etc. not shown, and a cylindrical section 19 provided between the paired joining sections 16, 18.

As shown in FIGS. 5A and 5B, the roof panel 12 is such that its forward end side mounted on the support fitting 15, that is, the bus bar 6a side (serving as the anode) is arranged to correspond to the eaves side of the building and the bus bar 6b side (serving as the cathode) is arranged to correspond to the ridge side of the building. By doing so, the roof panel 12, like the underlying member 17, is inclined approximately at an angle θ (see FIG. 1).

Figure 1:
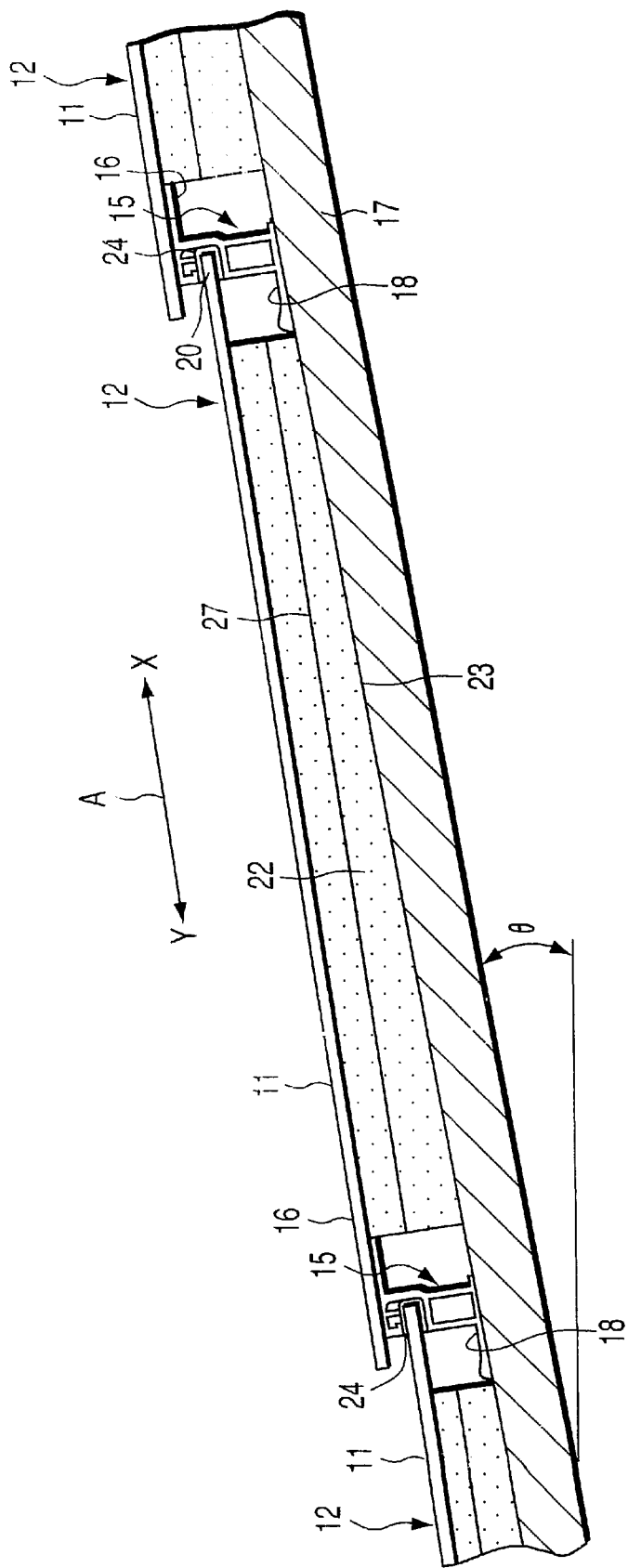
FIG. 1 is a side view showing a state of photovoltaic modules used as roof panels arranged in accordance with a first embodiment of the present invention.

In a double arrow A in FIG. 1, the one arrow X direction denotes the ridge side and the other arrow Y direction denotes the eaves side.

As shown in FIG. 2, the upper section of the cylindrical section 19 on one-side surface side is joined to the inner surface of the flange section 14 and this joining area is detachably threaded by a screw means 21 from an outer surface side of the flange section 14. By doing so, the above-mentioned photovoltaic module 11 is mounted through the support fitting 15 to the underlying member 17 of the roof.

At the lower surface of the mounting member 13, a back bearing member 22 is joined over the whole length of the support fitting 15 and made of an elastic material such as foamable polystyrene. As shown in FIG. 1, the lower surface of the back bearing member 22 is provided with a tapered joining surface 23 joined to the inclined surface of the underlying member 17. The back bearing member 22 acts adiabatically and also acts as a cushion for preventing the photovoltaic module 11 being flexed.

As shown in FIG. 2, the cylindrical section 19 of the support fitting 15 has a horizontal, substantially U-shaped (cross-section) insertion section 20 opened at its one-side upper area and a gasket 24 is fitted as a sealing member into the insertion section 20. The gasket 24 can also be formed as a horizontal, substantially U-shaped configuration (cross-section).

A rear end portion (the end portion of the bus bar 6b side acting as the cathode) of another photovoltaic module 11 is inserted into the gasket 24 on the eaves side. In other words, on the lower side as viewed along a direction from the ridge to the eaves of the roof as shown in FIG. 1 another photovoltaic module is inserted in a liquid-tight state. In the case where such photovoltaic modules 11 are placed to cover the roof in such a way, it is done by inserting the rear end portion of the photovoltaic modules 11 situated on the eaves side into the gasket 24 at the insertion section 20 of the support fitting 15 situated on the ridge side of the roof.

That is, the roof panels 12 can be placed from the ridge side toward the eaves side. It is possible to place the roof panels 12 on the roof in a comfortable work position while facing the ridge side of the roof. In addition, since the rear end side of the photovoltaic modules 11 of the roof panels 12 situated on the eaves side have only to be inserted into the insertion section 20 of the support fitting 15 of the roof panel 12 situated on the ridge side, the placement operation of the modules can be easily done and, further, it is possible to prevent rainwater from contacting the joined areas.

In prior systems, the placement operation was done with the worker positioned toward the eaves side on the roof which makes it very difficult to perform the placement operation because the worker has to be positioned face down.

Figure 4A:
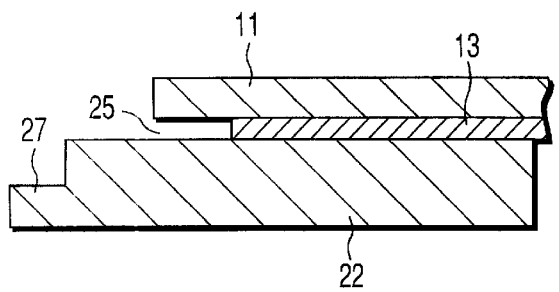
FIG. 4A is an enlarged view showing a width-direction of one end portion of the roof panel.

As shown in FIG. 4A, at one end of a width direction orthogonal to the forward/back direction (along the eaves-to-ridge direction), one end portion of the back bearing member 22 extends to an outermost position such that the photovoltaic module 11 extends to a lesser extent and the mounting member 13 is situated in the innermost position in the width direction. By doing so, the back bearing member 22 and photovoltaic module 11 define an insertion recess 25, which is an engaging section, corresponding to the thickness of the mounting member 13.

Figure 4B:
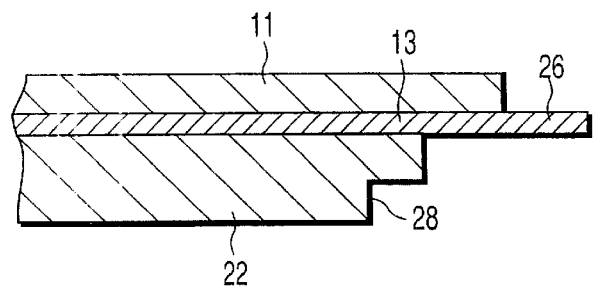
FIG. 4B is an enlarged view showing a width-direction of the other end portion of the roof panel.

As shown in FIG. 4B, at the other end of the width direction of the roof panel 12, the mounting member 13 extends to the outermost position of the width direction, followed by the photovoltaic module 11 and back bearing panel extending less further in that order.

By doing so, at the end of the width direction of the roof panel 12, the mounting member 13 extends a predetermined dimensional amount from the photovoltaic module 11 to provide a projection 26. Further, at one end and the other end of the width-direction of the back bearing member 22, steps 27, 28 are provided as to have a mutually engaging projection/recess structure.

At one end and other end of the roof panel 12, the insertion recess 25 and projection 26 are respectively provided in a manner to correspond to engaging sections, that is, recess and projection engaging sections.

Figure 4C:
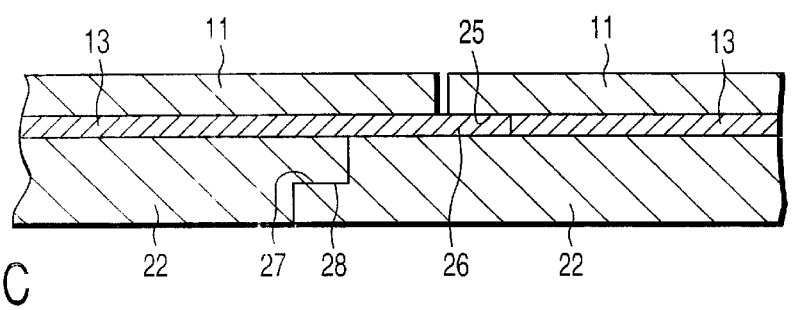
FIG. 4C is an enlarged view showing a state in which one end portion of a given roof panel is engaged with the other end of an adjacent roof panel.

And when the roof panels 12 are to be placed on the housing or building, as shown in FIG. 4C, into the insertion recess 25 at the one end of one of adjacent roof panels 12 in the width direction, the projection 26 at the other end of the other roof panel 12 is engaged.

In the adjacent roof panels 12 placed on the housing, the insertion recess 25 and projection 26 at both ends of the width direction are engaged and it is possible to prevent the flow of rainwater from the upper surface side to the lower surface side at the joining areas.

Through the engaging of the projection 26 to the insertion recess 25 and that of the one step 27 of the back bearing member 22 to the corresponding step 28 of another back bearing member 22, the end portions of the adjacent roof panels 12 provide a multi-bent detour path across the thickness direction of the roof panels 12 shown in FIG. 4C, and less rainwater is passed from the upper surface side to the lower surface side.

In the case where, due to a problem or damage occurring in the photovoltaic module 11, the photovoltaic module has to be replaced by a new photovoltaic module, the flange section 14 of the mounting member 13 provided on the rear surface of the replacement photovoltaic module 11 is detached by loosening and removing the screw 21 (see FIG. 2). And the photovoltaic module 11 (roof panel 12) therefore can be smoothly detached by slidably moving the photovoltaic module 11 toward the eaves side.

That is, when the roof panel 12 is replaced, even if the roof panel 12 has its width-direction ends set relative to adjacent ends of adjacent panels, it is possible to smoothly remove it and replace it with a new one.

In other words, only one photovoltaic module needs to be exchanged and replaced and, in this case, the detaching operation and the assembling of a new photovoltaic module 11 can be done by loosening and removing the screw 21. Thus, the exchange operation can be easily and quickly performed.

In the roof panel 12 of such a construction, if the seal of the photovoltaic module 11 by the resin 8 is broken for some reason, there is a risk that the rainwater will penetrate into the sealing area and, if this happens, there is the possibility that the bus area 6b serving as the cathode is corroded earlier than the bus area 6a serving as the anode.

However, in the present invention, the roof panel 12 is placed on the roof with the bus bar 6b of the cathode of the photovoltaic module 11 set on the ridge side and with the bus bar 6a of the anode set on the eaves side of the building. In other words, the bus bar 6b of the cathode is set on the upper side as viewed in the up/down direction than the bus bar 6a of the anode.

For this reason, even if the photovoltaic module's 11 seal become incomplete, less water is accumulated on the ridge side than on the eaves side. In particular, in the roof panel 12 of a type as shown in FIG. 1, rainwater cannot easily seep into the ridge side of the building and contact the area around the bus bar 6b of the cathode, and the area around bus bar 6b is not submerged for a prolonged period of time. The present invention therefore prevents early corrosion of the cathode.

Even if the roof panel is not of a type as shown in FIG. 1, but of a type in which a ridge side of a photovoltaic module 11 is directly exposed with rainwater, etc., the rainwater readily flows onto the eaves side and neither intrudes into the area around bus bar 6b serving as the cathode nor submerges it for a prolonged period of time. The area around bus bar 6b serving as the cathode therefore does not experience early corrosion.

There are sometimes cases where, depending upon the structure of the photovoltaic module 11, bus bars 6a and 6b serving as a cathode and anode, respectively, are partly exposed to the outside. Even in such a case, however, the bus bar 6b of the photovoltaic module 11 serving as the cathode is arranged in a higher position than the bus bar 6a serving as the anode. As a result, less rainwater submerges the area around bus bar 6b serving as the cathode and early corrosion is less likely.

That is, since the bus bar (cathode) 6b of the photovoltaic module 11 is located at a higher position in an up/down direction than the bus bar 6a serving as the anode, earlier corrosion of the area around bus bar 6b serving as the cathode is prevented, thus ensuring a long life of the photovoltaic module.

Figure 7A:
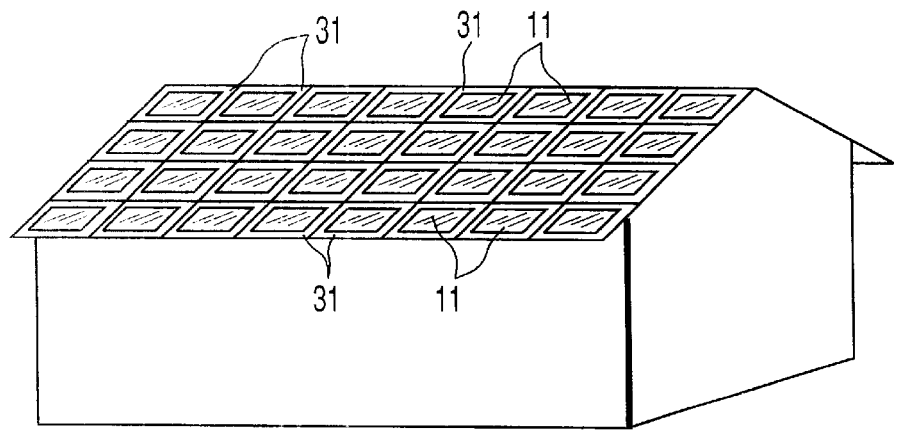
FIG. 7A is a perspective view showing a building to which a second embodiment of the present invention is applied.
Figure 7B:
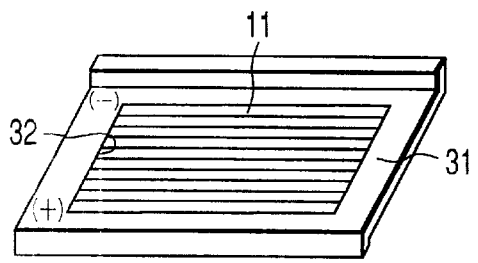
FIG. 7B is a perspective view showing a roof tile used in the second embodiment of the present invention.

Although, in the first embodiment, the photovoltaic module 11 has been explained as being used as the roof panel 12, it may be provided on roof tiles 31 on a second embodiment as shown in FIGS. 7A and 7B. That is, a recess 32 is provided in the roof tile 31 so that the photovoltaic module 11 can be placed therein.

In this case, when the roof tiles 31 are placed on the roof of the building, a cathode-side bus bar 6b is so held in the recess 32 as to have the bus bar 6b set on a ridge side of the building.

By doing so, as in the case of the first embodiment, the area around bus bar (cathode) of the photovoltaic module 11 is less likely to be exposed to rainwater, so no early corrosion occurs in the area around the bus bar 6b of the cathode.

Figure 8:
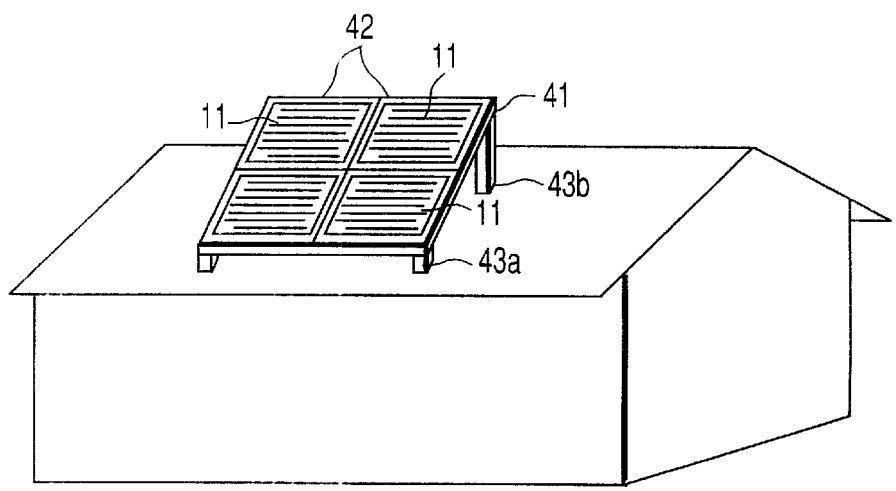
FIG. 8 is a perspective view showing a third embodiment of the present invention.

FIG. 8 shows a third embodiment of the present invention. In this embodiment, a mount base 41 is provided on the roof of a building. Rectangular frame-like units 42 are provided on the mount base 41 with each photovoltaic module 11 held by the frame-like unit. Even if the photovoltaic module 11 is set in such a way, a bus bar 6b serving as a cathode is set at a higher position than a bus bar 6a serving as an anode.

In this embodiment, front side legs 43a and back side legs 43b have their length so set, in order that the mount surfaces of the photovoltaic modules 11 on the mount base 41 may absorb enough sunlight.

By doing so, the area around bus bar (cathode) 6b of each photovoltaic module 11 on the mount base 41 is less likely to be exposed to rainwater and the area around bus bar (cathode) 6b can be prevented from being corroded earlier.

The mount base 41 may be installed not only on the roof of the building but also at other locations, such as directly on the ground or on other surfaces on the building or close to the building.

Even if the photovoltaic module 11 is provided on an outer wall member, other than the roof panel 12, such as on a sidewall member, the bus bar 6b serving as the cathode is set at a higher position than the bus bar 6a serving as the anode and, as a result, it is possible to prevent early corrosion of the area around bus bar 6b.

The photovoltaic module 11 can also be installed such that the bus bars 6a, 6b are tilted. In the case where the photovoltaic module 11 is so installed as to have its bus bars 6a, 6b set in a tilted state or the photovoltaic module 11 with tilted bus bar is installed, it is helpful if over 50% of a full length of the bus bar 6b serving as the cathode is positioned at a higher position than the highest portion of the bus bar (anode) 6a as viewed in an up/down direction of the bus bar 6a.

Further, over 65% or over 80% of the full length of the bus bar (cathode) 6b is preferably set at a higher position than the highest portion of the bus bar 6a as viewed in an up/down direction position of the bus bar (anode) 6a.

Further, it is most preferable that, when the photovoltaic module 11 is set on the roof, etc., all the panels have their bus bars (cathodes) 6b set higher at their positions than their bus bars (anodes) 6a as viewed in the up/down direction of the bus bar 6b. If setting the bus bars (cathodes) 6b higher than the bus bars (anodes) 6a of the modules from an up/down positional relation is so done, the modules can prevent the corrosion of the area around bus bars (cathodes) even in the case where the number or area of the photovoltaic modules 11 so set is over 50%, over 80% or over 90% based on the whole number or area of the photovoltaic modules.

Although, in the above-mentioned embodiments, the bus bars acting as the cathode and as the anode have been explained, the present invention can of course be applied even if a photovoltaic module is of such a type as to have a cathode and anode without the use of the above-mentioned bus bars.

Further, the present invention can also be applied not only to an amorphous type photovoltaic module but also to a single crystalline type or a polycrystalline type photovoltaic module including a thin film polycrystalline type.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A photovoltaic device adapted to be mounted on a roof, the roof defining a ridge and an eaves and having an underlying member, the photovoltaic device comprising:
    a roof panel including a photovoltaic module, the photovoltaic module comprising a substrate, and a cathode and an anode disposed on the substrate near a first and a second end portion of the roof panel, respectively; and
    a support fitting attached to the roof panel on a lower surface thereof near the second end portion thereof, the support fitting being adapted to be mounted on the underlying member of the roof such that the first end portion of the roof panel is located closer to the ridge and the second end portion is located closer to the eaves.

2. The photovoltaic device of claim 1, wherein the photovoltaic module further comprises a plurality of photoelectric conversion cells formed on the substrate and disposed between the cathode and the anode, and resin formed on the surface of the substrate to encapsulate the photoelectric conversion cells, the cathode and the anode.

3. The photovoltaic device of claim 1, wherein the support fitting is detachably attached to the roof panel, and wherein the support fitting has an insertion section opening toward the eaves and adapted for receiving and retaining a first end portion of an adjacent roof panel when mounted on the underlying member of the roof.

4. The photovoltaic device of claim 3, wherein the roof panel further includes a plate-shaped mounting member joined to a lower surface of the photovoltaic module, the mounting member having a flange section bent downwardly near the second end portion of the roof panel for attaching the roof panel to the support fitting.

5. The photovoltaic device of claim 4, further comprising a back bearing member made of an elastic material and attached to a lower surface of the mounting member, the back bearing member being disposed between the roof panel and the underlying member of the roof to act as a cushion when the support fitting is mounted on the underling member.

6. The photovoltaic device of claim 5, wherein the roof panel further has a third and a fourth end portion extending substantially perpendicular to the first and second end portions, the third end portion defining an insertion recess and the fourth end portion defining a projection, the insertion recess being adapted to mate with a projection of an adjacent roof panel when mounted on the roof.

7. The photovoltaic device of claim 6, wherein the mounting member near the third end portion is recessed relative to the photovoltaic module and the back bearing member to provide the insertion recess, and the mounting member near the fourth end portion protrudes relative to the photovoltaic module and the back bearing member to provide the projection.

8. A photovoltaic device adapted to be mounted on a roof, the roof defining a ridge and an eaves and having an underlying member, the photovoltaic device comprising:
    a roof tile adapted to be mounted on the roof in an orientation with respect to the ridge and eaves; and
    a photovoltaic module attached to a top surface of the roof tile, the photovoltaic module having a substrate and a cathode and an anode disposed on the substrate, the cathode and anode being laterally spaced apart such that when the roof tile is mounted on the roof in the orientation, the cathode is located closer to the ridge and the anode is located closer to the eaves.

9. A photovoltaic device adapted to be mounted on a roof, the roof defining a ridge and an eaves and having an underlying member, the photovoltaic device comprising:
    a mount base adapted to be mounted on the roof in an orientation with respect to the ridge and eaves; and
    a photovoltaic module attached to a top surface of the mount base, the photovoltaic module having a substrate and a cathode and an anode disposed on the substrate, the cathode and anode being laterally spaced apart such that when the mount base is mounted on the roof in the orientation, the cathode is located closer to the ridge and the anode is located closer to the eaves.

10. A method for installing a photovoltaic module on a roof, the roof defining a ridge and an eaves and having an underlying member extending in a lateral direction between the ridge and eaves, the photovoltaic module comprising a cathode and an anode formed on a substrate and spaced apart in a lateral direction of the substrate, the method comprising mounting the photovoltaic module on the underlying member of the roof via a mounting member, wherein the cathode is disposed closer to the ridge and the anode is disposed closer to the eaves.

11. The method of claim 10, further comprising:
    subsequently installing another photovoltaic module on the roof located closer to the eaves than the previously installed photovoltaic module, wherein a portion of the subsequently installed photovoltaic module closer to the ridge is disposed under a portion of the previously installed photovoltaic module closer to the eaves.

* * * * *